(12) United States Patent  
Ismail et al.

(10) Patent No.: US 8,109,769 B1
(45) Date of Patent: Feb. 7, 2012

(54) MICROMACHINED FLEX INTERPOSERS

(75) Inventors: Salleh Ismail, El Monte, CA (US);
Patrick Kayatta, Medford, CA (US)

(73) Assignee: Rogue Valley Microdevices, Medford, OR (US)

( * ) Notice: Subject to any disclaimer, the term of this patent is extended or adjusted under 35 U.S.C. 154(b) by 0 days.

(21) Appl. No.: 12/972,300

(22) Filed: Dec. 17, 2010

(51) Int. Cl.
*H01R 12/00* (2006.01)

(52) U.S. Cl. ........................................... 439/66

(58) Field of Classification Search ............ 439/66, 439/91, 591
See application file for complete search history.

(56) References Cited

U.S. PATENT DOCUMENTS

| | | | | |
|---|---|---|---|---|
| 4,548,451 A | * | 10/1985 | Benarr et al. | 439/85 |
| 6,315,576 B1 | * | 11/2001 | Neidich | 439/66 |
| 7,217,139 B2 | * | 5/2007 | Jaquette et al. | 439/66 |
| 7,396,236 B2 | * | 7/2008 | Eldridge et al. | 439/66 |
| 7,458,817 B2 | * | 12/2008 | Hougham et al. | 439/66 |
| 7,479,014 B2 | * | 1/2009 | Hougham et al. | 439/66 |
| 7,568,917 B1 | * | 8/2009 | Malstrom et al. | 439/66 |
| 7,585,173 B2 | * | 9/2009 | Hilty et al. | 439/66 |
| 2005/0106902 A1 | * | 5/2005 | Hougham et al. | 439/66 |
| 2005/0208786 A1 | * | 9/2005 | Dittmann | 439/66 |
| 2011/0151688 A1 | * | 6/2011 | Beaman | 439/66 |

\* cited by examiner

*Primary Examiner* — Gary F. Paumen
(74) *Attorney, Agent, or Firm* — Baumgartner Patent Law; Marc Baumgartner

(57) ABSTRACT

Micromachined flex interposers and methods of making the same are provided herein. More specifically the teachings herein are directed to interposer pins and strips having a rigid substrate supporting upper and lower cantilevered ends having a polyimide layer and a metal layer configured to flex towards the substrate layer during connection with upper and lower contact pads. Additional layers of polyimide and metal can be added to affect the flexibility and robustness of the pins and strips herein.

19 Claims, 8 Drawing Sheets

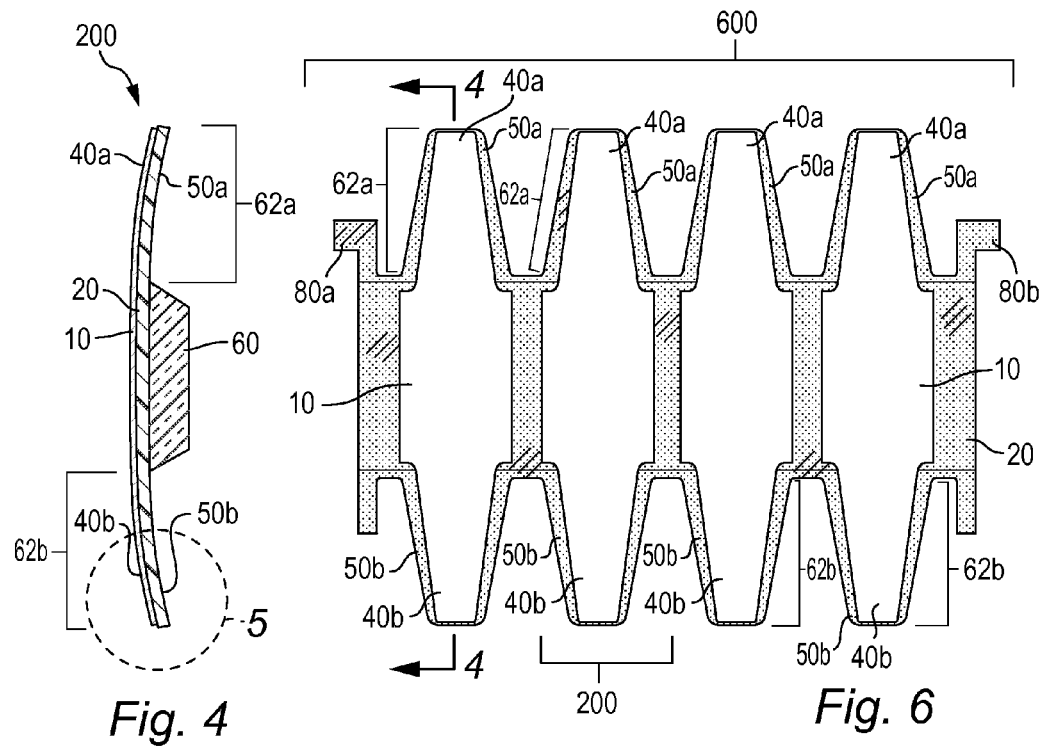
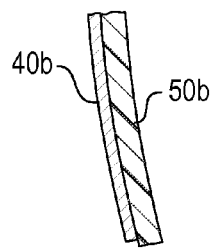
Fig. 4
Fig. 5
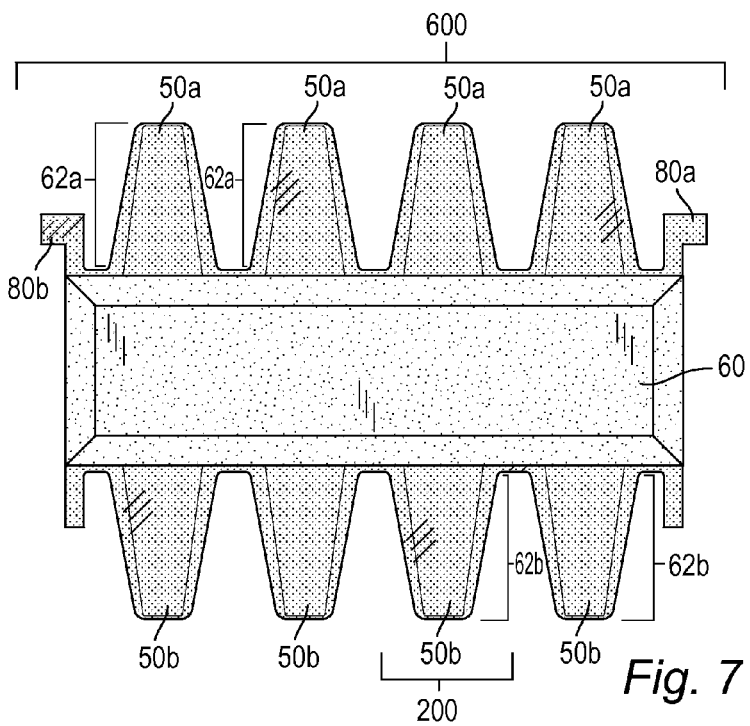
Fig. 6
Fig. 7

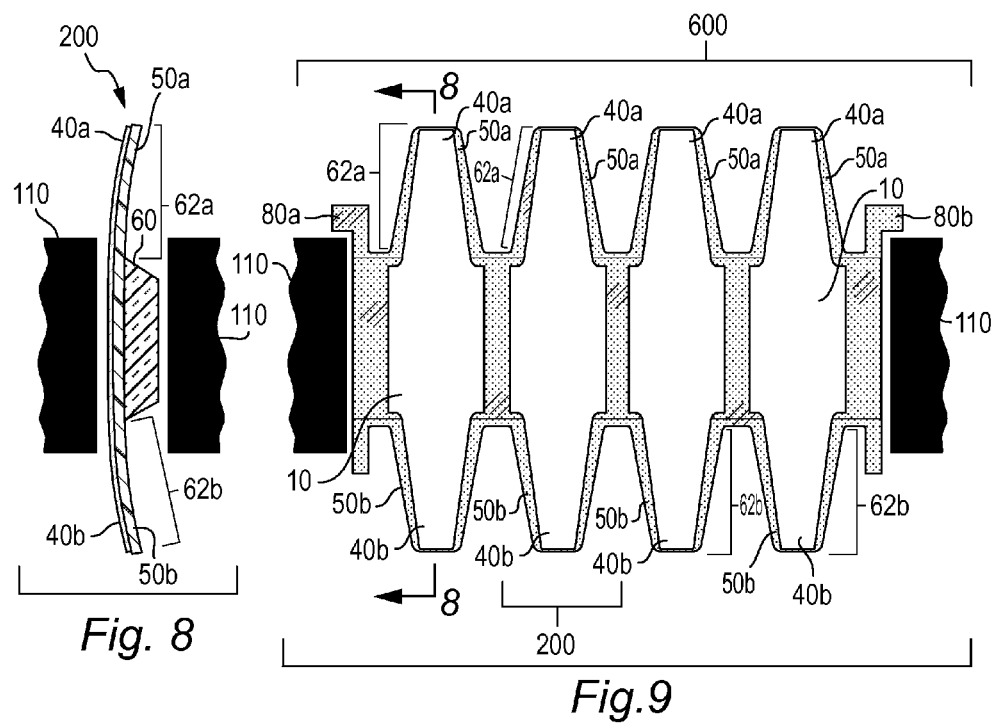
Fig. 8
Fig. 9
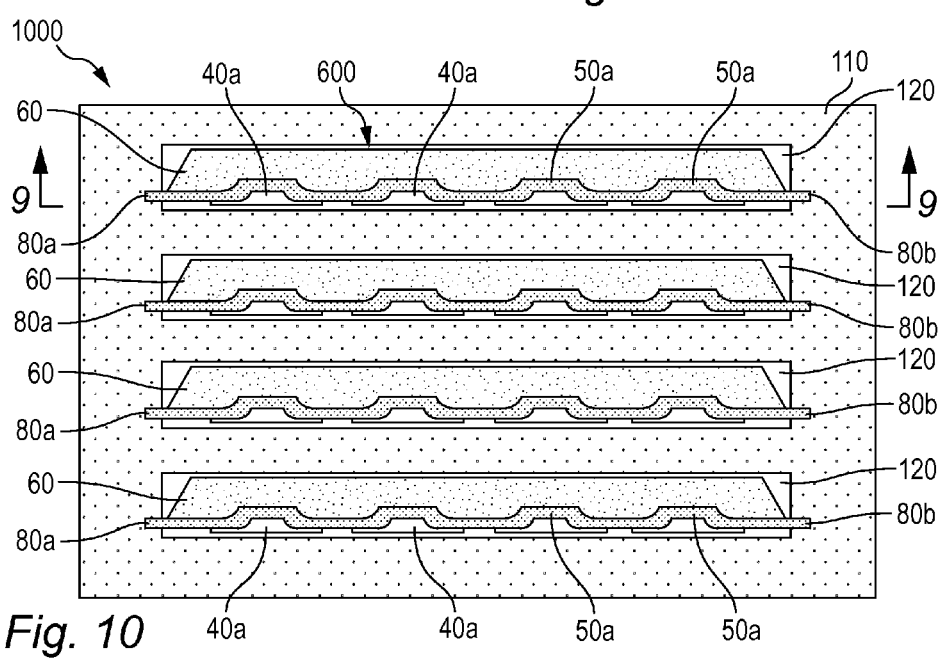
Fig. 10

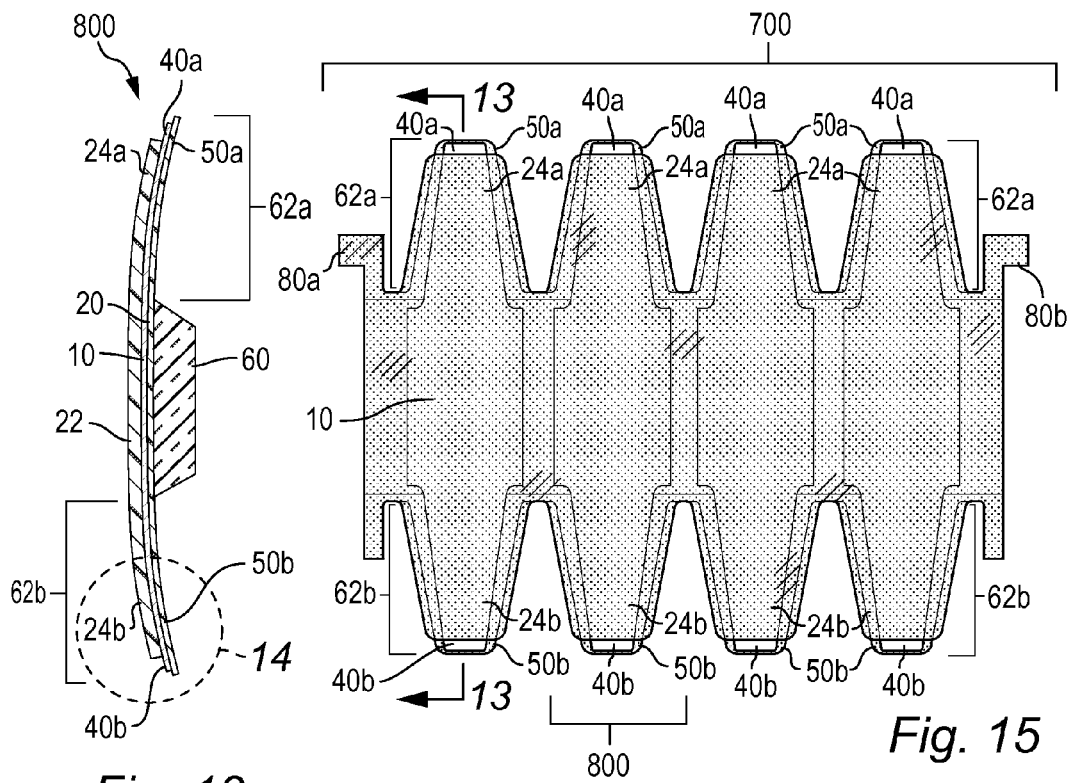
Fig. 13
Fig. 15
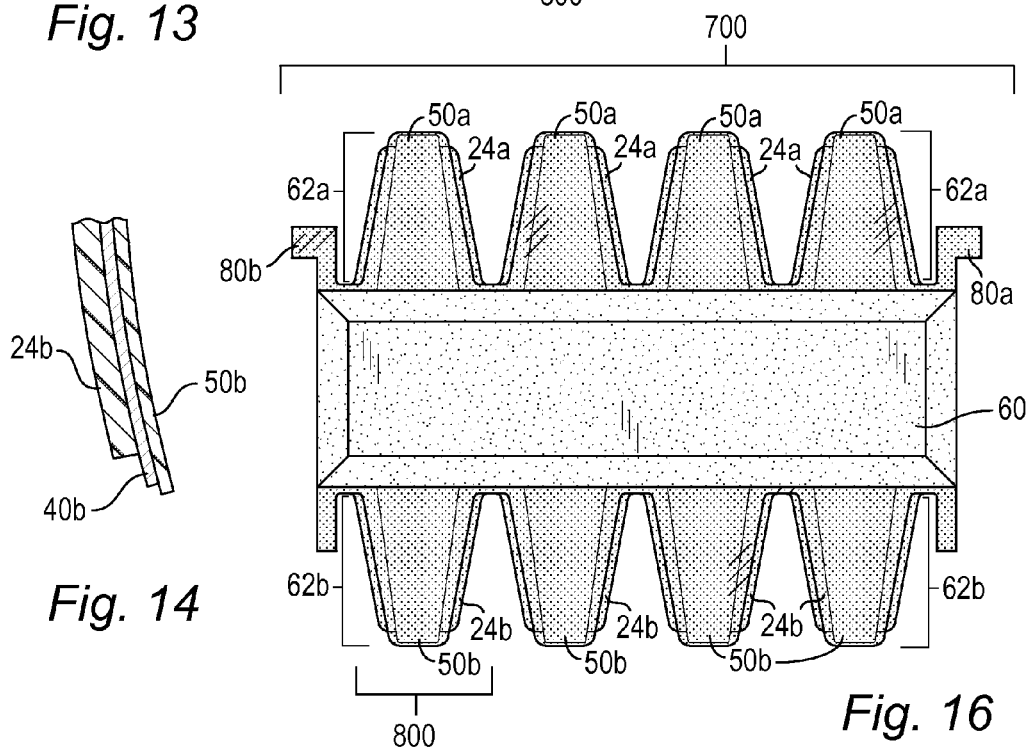
Fig. 14
Fig. 16

MICROMACHINED FLEX INTERPOSERS

FIELD OF THE INVENTION

The teachings herein are directed to new flexible interposers and methods of making the same.

BACKGROUND

In general, an interposer is an electrical interface having means for routing between one socket, contact, or connection to another socket, contact, or connection. The purpose of an interposer is to spread an electrical connection to a wider pitch or to reroute an electrical connection to a different connection.

Interposers are often used as connectors in the field of micro-electro mechanical systems (MEMS). MEMS, also known in the art as "micromachines," are typically made up of individual components and generally range in size from 20 micrometers to a millimeter. As one example, interposers are often used in MEMS style probe cards designed to test and validate the circuitry of semiconductor wafers. Probe cards typically include a printed circuit board (PCB) and a probe head consisting of a substrate and probe contactors. An interposer can be positioned between the PCB and the probe head and have a plurality of pins that serve as electrical interconnects between the contacts of the PCB and the corresponding contacts on the substrate which are in operable communication with the probe contactors.

One problem of current interposers is that the vertical compression associated with the probe heads contacting the semiconductor during "touchdown" applies mechanical stress on the interposer pins which can lead to damage and malfunction. Accordingly new interposer pins are needed to help alleviate the mechanical stresses associated with interconnecting two electrical devices.

SUMMARY OF THE INVENTION

Embodiments herein are directed to an interposer pin having a rigid substrate operably coupled to an upper cantilever and a lower cantilever electrically coupled to each other, wherein, the upper cantilever is configured to flex towards the substrate and comprises a first layer of polyimide and a first layer of metal, wherein the metal is configured to electrically couple to a first device; and the lower cantilever is configured to flex towards the substrate and comprises a first layer of polyimide and a first layer of metal, wherein the metal is configured to electrically couple to a second device.

Further embodiments are directed to methods of manufacturing an interposer pin including the steps of: providing a rigid substrate; depositing a first layer of polyimide and a first layer metal onto said substrate; micromachining the rigid substrate such that the first layers of polyimide and metal define upper and lower cantilevers that are configured to flex towards the substrate as a result of the difference between the coefficients of thermal expansion of the first polyimide layer and the first metal layer and stress factors, wherein the upper and lower cantilevers are electrically coupled to each other and the metal layer of the upper cantilever is configured to electrically couple to a first device and the metal layer of the lower cantilever is configured to electrically couple to a second device.

Further embodiments are directed to arrays of interposer pins including a frame having a main body defined by an upper surface, lower surface, wherein the frame comprises a plurality of slots that vertically traverse through the main body of the frame and have openings through the upper and lower surfaces, and wherein the plurality of slots are individually configured to receive a strip having a plurality of interposer pins; and a plurality of strips, individually configured to be positioned within one of the plurality of slots in the frame, wherein the strips individually comprise: a rigid substrate operably coupled to a plurality of interposer pins, wherein the interposer pins individually include: an upper cantilever and a lower cantilever electrically coupled to each other, wherein, the upper cantilever extends through the slot opening on the upper surface of the frame and is configured to flex towards the rigid substrate and comprises a first layer of polyimide and a first layer of metal, wherein the first metal layer is configured to electrically couple to a first device positioned above the frame; and the lower cantilever extends through the slot opening on the lower surface of the frame and is configured to flex towards the rigid substrate, and comprises a first layer of polyimide and a first layer of metal, wherein the first metal layer is configured to electrically couple to a second device positioned below the frame.

BRIEF DESCRIPTION OF THE DRAWINGS

FIG. 4. depicts a cross-sectional side view of an upright interposer pin.

FIG. 5 depicts a close-up, cross-sectional view of the bottom end of a lower cantilever on an interposer pin.

FIG. 6 depicts a front view of an interposer pin strip.

FIG. 7 depicts a back view of an interposer pin strip.

FIG. 8 depicts a cross-sectional view of an upright interposer pin strip positioned within a frame.

FIG. 9 depicts a back view of an interposer pin strip positioned within a frame.

FIG. 10 depicts a top view of a frame holding multiple interposer pin strips.

FIG. 13. depicts a cross-sectional side view of an alternative interposer pin strip.

FIG. 14 depicts a close-up, cross-sectional view of the cantilevered bottom end of an alternative interposer pin.

FIG. 15 depicts a front view of an alternative interposer pin strip.

FIG. 16 depicts a back view of an alternative interposer pin strip.

DETAILED DESCRIPTION OF THE ILLUSTRATED EMBODIMENTS

Figure 1:
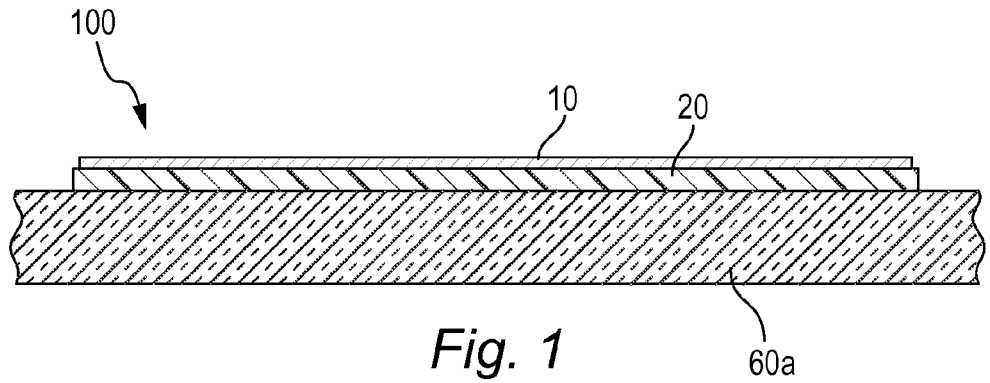
FIG. 1 depicts a side cross-sectional view of initial interposer pin layers before substrate micromachining.

Embodiments of the present invention are described below. It is, however, expressly noted that the present invention is not limited to these embodiments, but rather the intention is that modifications that are apparent to the person skilled in the art and equivalents thereof are also included.

The teachings herein are directed to the manufacture of individual interposer contact pins, strips of said pins, and arrays of said pins. As non exclusive examples FIGS. 6 and 7 respectively show the front and back of a strip 600 of four individual pins 200 while FIGS. 15 and 16 respectively show the front and back of a strip 700 of four individual pins 800. Additionally, FIG. 10 depicts an array 1000 of four interposer strips 600.

Manufacturing an interposer pin (e.g., 200, 800) or strip (e.g., 600, 700) according to the teachings herein can begin with the principles outlined in Example 1 below. The assembly 100 shown in FIG. 1 shows a layered assembly that can be shaped to become an interposer pin. As shown in this cross-sectional view, the early assembly 100 includes three layers: a metal 10, a polyimide 20, and an initial substrate layer 60*a*. The initial substrate layer 60*a* can be made of any suitable rigid support material but is preferably made of silicon. While the teachings herein will be primarily directed to the use of silicon as the initial substrate layer 60*a*, this is merely exemplary; other suitable rigid materials can be used as a substrate such as hard polymer, germanium and gallium arsenide, ceramics such as alumina, aluminum, nitride, low temperature co-fired ceramics (LTCC) and high temperature co-fired ceramics (HTCC), metals or glasses, for example. While a manufacture can begin with the finalized shape of the rigid substrate depending on the material used, it is preferred with the teachings herein that the initial substrate layer 60*a* includes sacrificial excess material that can be removed to achieve the final substrate form (e.g., 60, 60*b*)

Preferably a polyimide layer 20 is deposited onto the rigid substrate 60*a* using any suitable technique. As those with skill in the art are familiar with, polyimide is a polymer of imide monomers such as pyromellitic dianhydride, 4,4'-oxydianiline, and HD MICROSYSTEM™ Polyimide Product HD8820, for example. Polyimide materials are advantageous in the embodiments herein because they are lightweight, flexible, and resistant to heat and chemicals. Even more advantageously, the polyimide layer 20 can serve as a high-temperature adhesive between the initial substrate 60*a* and the metal layer 10 and as mechanical stress buffer. The polyimide layer 20 can be deposited by any suitable method including spin coating, spray coating, or lamination, for example. As used herein, spin coating relates to a procedure used to apply uniform, or substantially uniform, thin films of polyimide to the substrate 60*a*. An excessive amount of a polyimide solution is placed on the initial substrate layer 60*a*, which is then rotated at high speed in order to spread the fluid and remove excess by centrifugal force. Non exclusive preferred thicknesses of the polyimide layer 20 include 10, 12, 15, 20, 25, or 30 microns, or 10-30 microns, or substantially so. Once deposited, the polyimide layer 20 can be cured in Nitrogen at about 300-350° C. A small portion of the polyimide layer 20 (e.g., 0.5 μm) can be removed by plasma reactive ion etching (RIE) to create texture and surface micro-roughness. Thus if the initial deposition is 12 μm thick, the final thickness of the front side polyimide layer 20 after RIE can be about 11.5 μm. Any suitable gas mixture can be used in this RIE such as a mixture including oxygen with 2% of Tetrafluoromethane ($CF_4$), for example.

As alternative pins provided herein can include more than one layer of polyimide 20, the teachings herein can be used to deposit additional layers of polyimide (e.g., 22 and 20*a*). For embodiments utilizing multiple polyimide layers (e.g., interposer pin 800) the polyimide layers can have the same or differing thickness with respect to each other. Likewise the polyimide layers can either be made of the same polyimide or be made of different types of polyimides.

According to preferred embodiments the top layer of the assembly 100 is a metal 10 and more preferably a contact metal, non-exclusively including: gold, rhodium, palladium, cobalt, chromium, titanium, tungsten, and nickel. The metal layer 10 can be a pure metal, an alloy such as a nickel or copper alloy, or stacks of individual metal and alloy layers, for example. The metals or alloys defining each layer of a stacked metal layer 10 can be the same or be different types of metals or alloys Deposition thicknesses can also be the same or vary between the layers within a metal stack.

Figure 20:
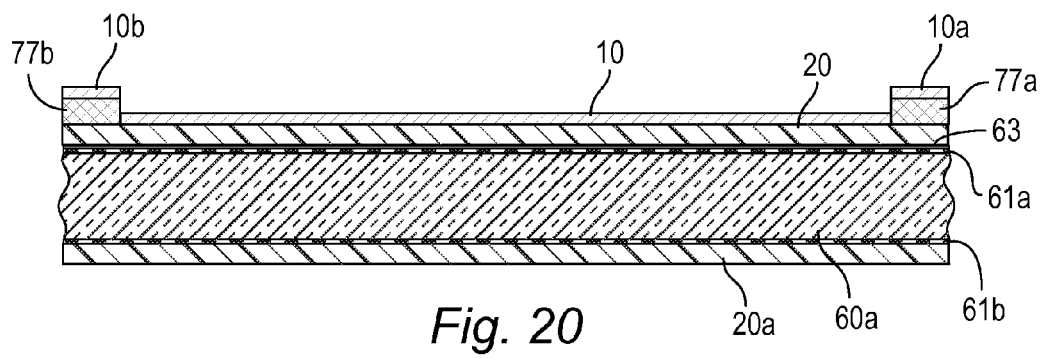
Figure 21:
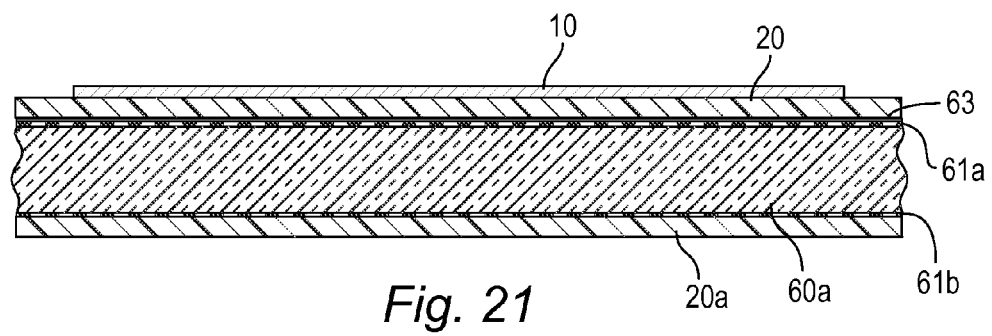

The metal layer 10 can be deposited on top of the polyimide layer 20 using any suitable means, such as by vacuum deposition including sputtering or evaporation, for example. The term vacuum deposition as used herein generally relates to a process of depositing a metal layer atom-by-atom or molecule-by-molecule at sub-atmospheric pressure onto the solid surface of the polyimide layer 20. Vacuum deposition allows a manufacturer precise control in layering the thickness of the metal layer 10. For example while the preferred thickness of the metal layer 10 is between 3-5 microns, vacuum deposition potentially allows for depositing a layer as thin as an atom and up to many millimeters thick. The condensing particles from vacuum deposition may come from any suitable source. One non-exclusive source could include thermal evaporation which involves a hot source metal being evaporated then condensed on the polyimide layer 20. Another non-exclusive source of condensing particles could come from sputtering. Sputter deposition, in this context, relates to metallic atoms being ejected from a solid target material from bombardment of the target by energetic particles. After ejection from the target material, the metal is deposited onto the polyimide layer 20 to form a metal layer 10 having a desired thickness. Alternatively, the metal layer can be deposited using electroplating. Non-exclusive preferred thicknesses of the metal layer 10 include 3, 4, or 5 microns, 3-5 microns, or substantially so. As illustrated in FIGS. 20 and 21, the deposition of the metal layer 10 can include a lift-off process which is a photolithography method to create structure patterns using photoresists 77*a* and 77*b* as a sacrificial material. More specifically an upper positioned photoresist 77*a* prevents the upper portion of metal 10*a* from attaching to the front side polyimide layer 20 while a lower positioned photoresist 77*b* prevents the lower portion of metal 10*b* from attaching to the front side polyimide layer 20.

Figure 2:
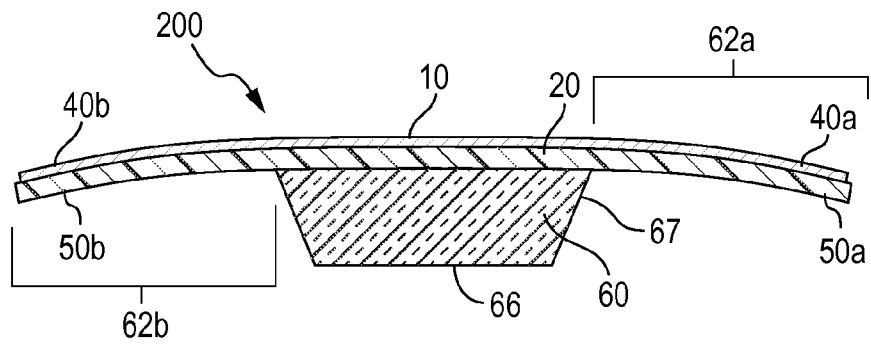
FIG. 2 depicts a cross-sectional side view of an interposer pin's layers after anisotropic wet etching.
Figure 3:
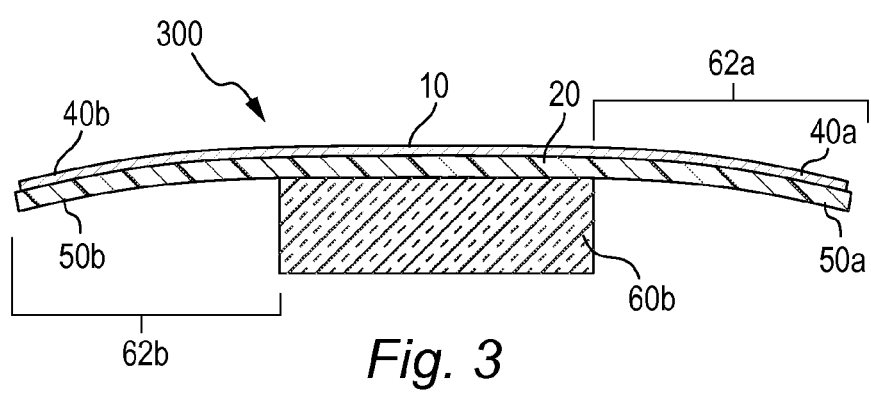
FIG. 3 depicts a cross-sectional side view of an interposer pin's layers after a plasma deep reactive ion etch.

According to preferred embodiments, and as shown in FIGS. 1-3, the metal 10 and the polyimide 20 are deposited and coupled together at a predetermined length to form the initial assembly 100. More specifically it is preferred that the metal layer 10 is deposited such that it is shorter in length than the polyimide layer 20. Both the polyimide layer 20 and the metal layer 10 can be formed or patterned using any suitable process, during deposition or afterwards such as photolithography and etching, to achieve the final configuration of the individual pins 200, 800 or pin strips 600, 700 described herein. Preferred methods of patterning the metal layer 10 include the use of photolithography, etching, or electroplating. Preferred shapes of metal layer 10 patterning and polyimide layer 20 shaping are shown in the pin strips depicted in FIGS. 6, 7, 9, 15, and 16. As shown in these figures, it is advantageous in certain embodiments to include side flanges 80*a* and 80*b* in the polyimide layer 20 for allowing a strip 600 to hang onto the top of an interposer frame 110. While not shown, side flanges can also be incorporated for embodiments directed to a single interposer pin, such that a single pin is adapted to hang onto the top of an interposer frame.

After the polyimide layer 20 has been deposited onto the substrate 60*a* and the metal layer 10 has been deposited onto the polyimide layer 20, the initial substrate layer 60*a* can be shaped into its desired shape. Typically, the initial substrate layer 60*a* includes excess material that is removed to achieve a final substrate shape. Any suitable means for shaping the substrate 60a can be used depending on the material of the substrate 60a and the desired final shape. The shaping of the initial substrate layer 60a can be done by micromachining, non-exclusively including the following general and specific methods: lithography, photolithography, etching, chemical etching, electro-chemical etching, electrical discharge machining, laser machining (e.g., ablation), and precision mechanical machining, or a combination of these methods, for example. According to more specific embodiments, the substrate 60a can undergo a plasma deep reactive ion etch (DRIE). As DRIE is a highly anisotropic process, it can be used to create very steep sides, such as the 90° walls, of the rectangular substrate 60b shown in the interposer pin 300 depicted in FIG. 3. Accordingly, preferred final substrates can have a rectangular cross-section 60b or substantially so such that the walls are between 87-93° with respect to the polyimide layer 20.

Additionally, the initial substrate layer 60a can be shaped by micromachining wet anisotropic etching. As shown in FIG. 2, anisoptropic wet etching can remove excess substrate material from the interposer pin 200 to form a final substrate 60 having a trapezoidal cross-section, for example. The angles of the angled sides of the trapezoid shaped substrate 60 can be any suitable angle with respect to the polyimide layer 20 such as between about 53-56°, or substantially so. According to preferred embodiments, the angles are 54.7°. The angle 54.7° is a natural angle between silicon (100) crystal plane 66 and silicon (111) crystal plane 67. The wet anisotropic etching of silicon such as by potassium hydroxide (KOH) etches the (Miller index 100) crystal plane 66 at a fast rate with almost no etch on the (Miller index 111) crystal plane 67. Accordingly, choosing an appropriate silicon wafer orientation such as (Miller index 100), and a hard mask etch design can produce a trapezoid 60 or pyramid (not shown) with natural angles. While the teachings and figures herein are primarily directed to embodiments utilizing a substrate having a trapezoidal cross-section 60 this is merely exemplary, as other rigid substrate shapes can readily be used with the teachings herein such as a rectangular substrate 60b, for example.

According to preferred embodiments, when the excess substrate material is removed by micromachining (e.g., etching) an upper cantilever 62a and lower cantilever 62b are exposed. With respect to FIGS. 3-12, the upper cantilever is defined by an upper polyimide extension 50a and an upper metal extension 40a while the lower cantilever 62b is defined by a lower polyimide extension 50b and a lower metal extension 40b. Advantageously, upon removal of the excess substrate material, the upper and lower cantilever 62a and 62b curve inwards towards the substrate 60 in the shape of a bow, such that the metal layer 10 and the polyimide layer 20 are convex with respect to the substrate 60. FIG. 4 depicts a cross-section of an interposer pin 200 in an upright position, while FIG. 5 shows a close up view of the end of the lower cantilever 60b that consists of the lower metal extension 40b and the lower polyimide extension 50b. As this close-up exemplifies it is preferred to have the lower polyimide extension 50b extend downwards more than the lower metal extension 40b. Likewise it is preferred that the upper polyimide extension 50a extends upwards past the upper metal extension 40a. These are expressly preferred embodiments, alternatively, the teachings herein can be directed to interposer pins and strips wherein the metal layer is equal to or extends beyond the polyimide layer (not shown).

According to advantageous embodiments, the curvature in the upper and lower cantilevers 62a and 62b is affected by the difference in the coefficient of thermal expansion (CTE) between the polyimide layer 20 and the metal layer 10 and other stress factors. More specifically, the CTE of the polyimide layer 20 is greater than the CTE of the metal layer 10 such that the volume of the polyimide layer 20 expands more with a change in temperature than the metallic layer 10. Thermal stress can be applied to the metal layer 10 and polyimide layers 20 during the shaping of either the initial substrate layer 60a, the polyimide layer 20 or the metal layer 10, or any intermediary layers that form before the final substrate (e.g., 60, 60b), metal layer 10, or polyimide layer 20 takes form. More specifically if photolithography is used to pattern the initial substrate layer 60a, the metal layer 10 or the polyimide layer 20, the assembly 100 may undergo baking cycles. Additional thermal stress can be generated from deposition processes of the different layers. Typically, the primary source of thermal stresses is derived from the curing of the polyimide layer 20 itself (or additional polyimide layers e.g., 20a and 22) as this process can undergo temperatures between 300-350° C. in Nitrogen ambient. A photolithography baking step to shape the substrate can also contribute to the thermal stress in the metal layer 10. Additionally any residual stress resulting from the temperature increase during patterning or deposition can also affect the curvature. Thus, the amount of residual stress and the difference in CTE between the metal layer 10 and the polyimide layer 20 can be controlled by a manufacturer to establish a desired angle of curve in the upper and lower cantilevers 62a and 62b. The amount of residual stress and difference in CTE can be controlled depending on the particular metal or metals selected for the metal layer 10 (which preferably possesses compressive stress), the particular polyimide selected for the polyimide layer 20, the length and thickness of these layers 10 and 20, deposition and processing techniques, and temperature control. The relationship between the cantilever 62a and 62b parameters and radius of curvature R can be illustrated as in Relation 1.

$$R \approx \frac{f(E_1, E_2)g(t_1, t_2)}{\Delta\sigma}$$

linear function of Young Modulus of material 1, $E_1$ (polyimide 20) and material 2, $E_2$ (metal 10) and respective thickness $t_1$ and $t_2$, and inversely proportional to the resultant stress difference $\Delta\sigma$. While the upper and lower cantilevers 62a and 62b can be set to have different angles of curvature, it is preferred that the above factors are controlled such that the angle of curvature for both cantilevers 62a and 62b are the same with respect to the position of the substrate 60. The embodiments herein are also applicable to pins having multiple polyimide and/or metal layers.

The metal, polyimide, and substrate layers described above can be used to manufacture an individual pin 200 or, as shown in FIGS. 6 and 7, a strip 600 having a plurality of pins 200. While FIG. 6 depicts a strip 600 having four pins 200, the number of pins can vary depending on the desired objectives of the interposer. Any suitable number of pins 200 can be connected onto a strip, including 2, 3, 4, 5, 6, 7, 8, 9, 10, or more pins 200, for example. According to preferred embodiments, the rigid substrate 60 laterally traverses across the strip 600 for support. The upper cantilever 62a can taper towards its top end, while the lower cantilever 62b can taper towards its bottom end. This tapering advantageously reduces the mechanical stress concentration in the cantilevers 62a and 62b when in compression or engagement of the interposer (e.g., FIG. 12). As higher stress imparts on the base of the cantilevers 62a and 62b near the substrate 60, the wider base provide more strength from unwanted mechanical failure. According to other non-preferred embodiments the upper and lower cantilevers can be configured to be vertically straight or substantially so (not shown). FIG. 6 depicts a front view of a preferred interposer strip 600 and exemplifies a preferred embodiment wherein the upper metal extension 40a does not vertically extend upwards past the upper polyimide extension 50a on the upper cantilever 62a. Similarly, the lower metal extension 40b does not vertically extend downward past the lower polyimide extension 50b on the lower cantilever 62b.

FIG. 10 depicts a top view of an exemplary interposer 1000 according to the teachings herein comprising a frame 110 having slots 120 configured to received pin strips 600. The teachings herein thus allow for an array of vertical electrical inter-connectors. Preferably the frame 110 is made of a suitably rigid material, and is either insulative by itself, and/or includes an insulating layer. To make the frame 110 insulating, one can either use one or more thick layers of materials and/or insulating materials such as polyimide. Alternatively, the frame can be made of the following non-exclusive materials: ceramic, hard plastic, FR-4, mylar, glass, metal, and silicon, and the like. While four slots 120 and four pin strips 600 are shown in FIG. 10, the number and slots and accompanying strips can vary according to the desires of the manufacturer, although it is preferred that the number of strips equals the number of slots. Accordingly, the interposer frames described herein can include 2, 3, 4, 5, 6, 7, 8, 9, 10, or more slots configured to individually receive the equivalent number of pin strips. Any suitable way of patterning the slots 120 into the frame 110 can be used, depending on the material the frame 110 is made of, including laser machining, etching, physical machining, chemical means, and the like. For example if the frame 110 is made of silicon, slots 120 can be generated by DRIE and oxidation to create insulation. As another example, if the frame 110 is made of polyimide, the slots 120 can be generated by laser drill machining.

Figure 11:
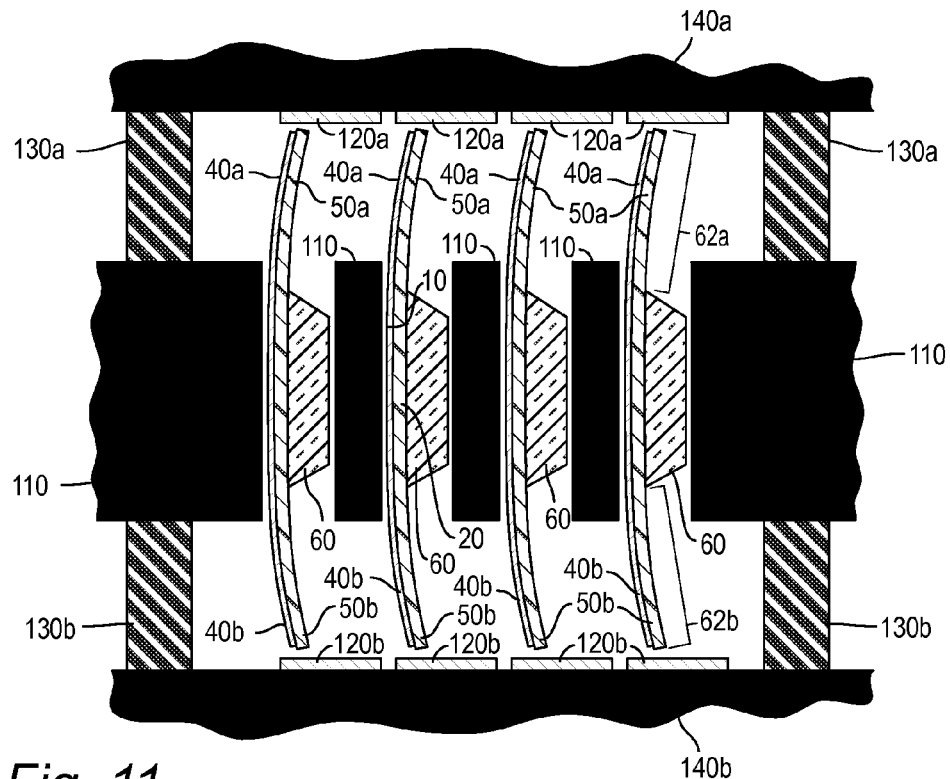
FIG. 11 depicts a cross-sectional side view of interposer pin strips positioned within a frame in a disengaged state.
Figure 12:
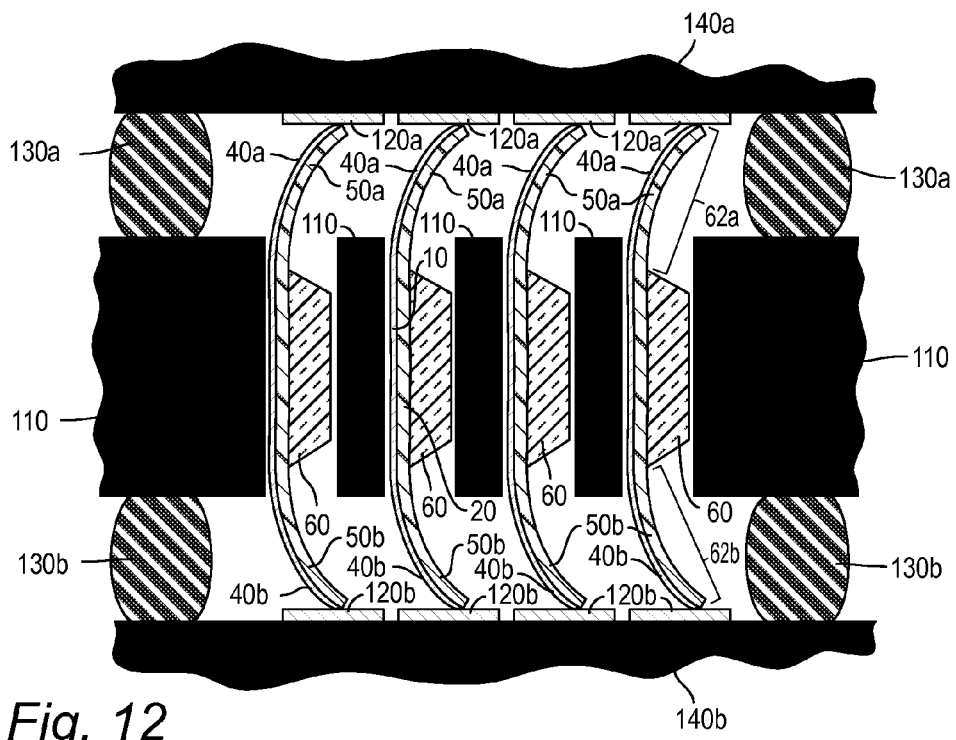
FIG. 12 depicts a cross-sectional side view of interposer pin strips positioned within a frame and in an engaged state.

As shown in the side views of FIGS. 11 and 12, it is preferred that the slots 120 vertically traverse the entire height of the frame 110, such that top and bottom openings are defined. More specifically, it is preferred that the upper cantilevers 62a of the pins 200 extend upward above the slots 120, and the lower cantilevers 62b of the pins 200 extend downward below the slots 120. Even more specifically, it is preferred that the slots 120 and the pins 200 are configured such that the upper cantilevers 62a and lower cantilevers 62b extend the same distance away from the slots 120, or substantially so. Additionally it is preferred that the width and length of the slots 120 are sized such that the strips 600 fit snugly within.

As shown in FIGS. 9 and 10, one preferred way of securing the strips 600 within the slots 120 include the use of flanges 80a and 80b that extend outwards from the upper sides of the strips 600. The flanges 80a and 80b can be configured to extend parallel, or substantially so, to the top surface of the frame 110 and can rest on top of said surface to hold the strip 600 securely in place. While not shown, the upper surface of the frame 110 can include small slits configured to receive the flanges 80a and 80b. While the flanges can be made of the polyimide layer 20, other suitable materials and shapes of flanges and methods of coupling to the frame are readily contemplated herein. The use of flanges 80a and 80b are advantageous in that it allows a user to readily remove or install a pin strip 600 more easily. Ease of removal can especially be advantageous if a pin 200 or a pin strip 600 malfunctions and need to be replaced by another pin 200 or a strip 600. This allows the user to simply replace one pin 200 or strip 600 instead of the entire interposer.

While the frame 110 is depicted holding a plurality of a particular type of pin strip 600 it is also readily contemplated that the frames herein include slots configured to hold a single contact pin (e.g., 200, 800) or differently patterned strips (e.g., 700).

The pins 200, strips 600 and interposers 1000 provided herein can be used to electrically interconnect any two suitable devices having contact pads or electrical connections. As one common use of interposers is in a semi-conductor probe card to interconnect a printed circuit board (PCB) and a probe contactor substrate, this is expressly contemplated as a preferred use of the devices herein. FIGS. 11 and 12 show the frame 110 and the pins 200 positioned between an upper device 140a (e.g., PCB) having upper contact pads 120a and a lower device 140b (e.g., probe contactor substrate) having lower contact pads 120b. While FIGS. 11 and 12 show a cross section view, it is contemplated that the four cross-sectional views of the pins 200 can represent individual pins or a strip 600 having multiple pins. Likewise, the four cross-sections of contact pads 120a and 120b can represent a single contact pad or a row having a plurality of contact pads. It is preferred to provide an interposer 1000 having a pin 200 for each upper and lower contact pad 120a and 120b.

In FIG. 11, the pins 200 are in an unengaged state, such that the upper metal extensions 40a are floating and not in contact with the upper contact pads 120a on the upper device 140a and the lower metal extensions 40b are floating and not in contact with the lower contact pads 120b on the lower device 140b. While not shown, the interposer pins can be configured to interconnect upper and lower sockets or other electrical connections beside contact pads 120a and 120b.

To maintain this determined and precise vertical gap between the metal extensions and 40a and 40b and the contact pads 120a and 120b, and to allow for uniform compression, upper spacers 130a and lower spacers 130b can be used with the frames 110 described herein. Preferably the upper and lower spacers 130a and 130b are configured to act as vertically compressible springs such that when the upper device 140a and the lower device 140b are pressed towards each other the spacers 130a and 130b compress to allow the polyimide extensions 50a and 50b to slide along the contact pads 120a and 120b until the metal extensions 40a and 40b establish electrical connections with the contact pads 120a and 120b. The spacers 130a and 130b are preferably made of a compressible elastomer such as rubber, or silicon rubber, but can also be springs made of metal or plastic, for example. The particular number of upper spacers 130a and lower spacers 130b can vary depending on the materials and the amount of compression desired by the user. As one, non-limiting example: 4, 6, 8, 10, 12, or more spacers can be used. Preferably, four upper spacers 130a are positioned in the corners on the top surface of the frame 110 while four lower spacers 130b are positioned in the corners on the lower surface of the frame. The spacers 130a and 130b can be coupled to the frame 110 using any suitable means, including for example adhesives such as glue.

An engaged configuration is depicted in FIG. 12. It is advantageous that when the electrical connections are established, the upper and lower cantilevers 62a and 62b flex even more towards their connected rigid substrates 60 than their natural floating configuration shown in FIG. 11. Accordingly, the pins 200 act as springs, and more specifically it is preferred they are configured to act as upright leaf springs. The amount of flex in the pins 200 can be non-exclusively controlled by adjusting the materials, length, and thickness of the metal layer 10, polyimide layer 20, and the substrate 60, and the height and materials of the spacers 130a and 130b. Additional ways of controlling flex is in the actual number of polyimide and metal layers used with the pins.

Once the vertical compression force has been removed, the spacers 130a and 130b expand back to their natural state, the metal extensions 40a and 40b slide off the contact pads 120a and 120b to re-establish a disengaged state as shown in FIG. 11. The flexibility of the pins 200 and the horizontal sliding of the metal extensions 40a and 40b on and off of the contact pads 120a and 120b is an advantageous aspect of the teachings herein as less mechanical stress is applied to the pins 200 compared to if they were to directly connect with the contact pads 120a and 120b in a vertical direction. Limiting mechanical stress such as through direct vertical compression is highly advantageous as it lessens the likelihood of damage to the pins 200 and thus the potential for malfunction. A common example of a vertical compression that can result in the engagement of the pins 200 is during a touchdown, when a probe card presses downward onto a semiconductor to establish electrical connection with the probe heads. It is expressly contemplated that further sources of compression between an upper and lower device 140a and 140b can be used with the teachings herein. Non-exclusive uses of the pins 200 and pin strips 600 herein can thus include connecting any suitable land grid array (LGA) of a microprocessor, digital processor or another integrated circuit to a PCB, and the like.

The use of only one layer of polyimide 20 and one layer of metal 10 with the substrates 60 herein is expressly non-limiting, as additional layers of polyimide and/or metal can be used to affect the robustness or flexibility of the pins and strips described herein. Additionally other materials such as silicon, amorphous silicon, poly-silicon, any dielectric materials such as silicon dioxide, silicon nitride, metal oxide, metal nitride can be used to manufacture the pins and strips herein. As one example, the pins 800 and strips 700 shown in FIGS. 14-17 include two layers of a polyimide—an inner layer 20 and an outer layer 22 that sandwich the metal layer 10. According to this particular embodiment, the upper and lower cantilevers 62a and 62b include three layers. More specifically, the upper cantilever 62a encompasses an upper inner polyimide extension 50a, an upper metal extension 40a, and an upper outer polyimide extension 24a, while the lower cantilever 62b encompasses a lower inner polyimide extension 50b, a lower metal extension 40b, and a lower outer polyimide extension 24b. According to this particular embodiment it is preferred that the inner polyimide layer 20 is longer than the metal layer 10 and the outer polyimide layer 22 is shorter than the metal layer 10 to allow for electrical connection with the contact pads 120a and 120b. If both polyimide layers 20 and 22 were longer than the metal layer 10, electrical connection with the contact pads 120a and 120b would not occur. Advantageously, the outer polyimide layer 22 can provide passivation/insulation for the pins 800, and prevent conductive or otherwise damaging foreign particles that could short or malfunction the pins 800.

Additional layers of metal and polyimide can also be added in alternative embodiments including additional layers of metal and/or polyimide (not shown). For example an outer layer of metal can be deposited onto the outer polyimide layer 22 to create four layers on the pin. These alternative designs of strips and pins can be manufactured according to the techniques described herein (e.g., photolithography, etching, metal deposition, polyimide deposition, and the like) and likewise be similarly used with the frames and devices described above. According to alternative embodiments, the inner polyimide layer can be shorter than the metal layer. As one example the metal layer, can be wrapped around the upper and lower ends of the inner polyimide. Additional non-preferred embodiments include assemblies and methods wherein a metal layer is deposited onto the substrate first and then a polyimide is deposited afterwards.

Example 1

The following prophetic example details a preferred method of manufacturing the interposer strips and pins herein. The processes described below are expressly non-limiting and can readily be used in conjunction with the teachings above. While this particular example details the manufacture of a pin having an inner and outer polyimide layer sandwiching a metal layer, the principles can be used to construct pins having different numbers of metal and polyimide layers.

Figure 17:
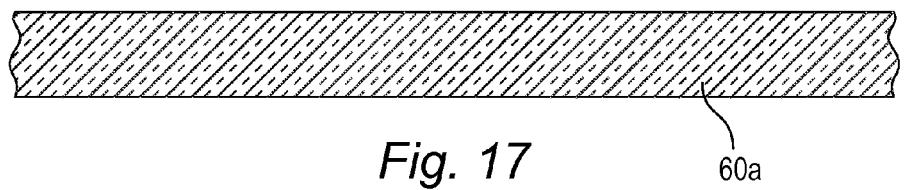
FIGS. 17-25 depict a multi-step method of making an interposer pin.

FIG. 17 shows a starting initial substrate layer 60a oriented on its side such that its front side is facing upwards while its back side is facing downwards. The substrate layer 60a is made of a silicon wafer and has a p-type of resistivity greater than 1 Kohm.com. The wafer is polished on both sides with very uniform thickness of 200 µm with a tolerance of ±5 µm. Alternatively the silicon wafers herein can be between 100 to 400 µm.

Figure 18:
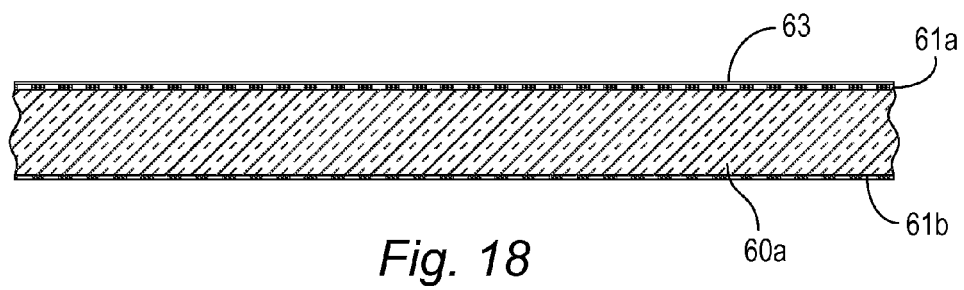

As shown in FIG. 18, the silicon substrate wafer 60a is coated with etch stop layers 61a and 61b on both front and back sides. The etch stop layers 61a and 61b are applied using low stress, low pressure chemical vapor deposition (LPCVD) silicon nitride at a thickness of about 1 µm and a residual stress of about +200 MPa. A thin layer of amorphous silicon 63 having a film stress of about −800 Mpa is then deposited by plasma enhanced chemical vapor deposition (PECVD) on top of the front etch stop layer 61a. A preferred thickness is about 0.25 µm. Advantageously, the amorphous silicon layer 63 provides surface properties that enhance the adhesion of the front polyimide layer 20 which is applied in the next step.

Figure 19:
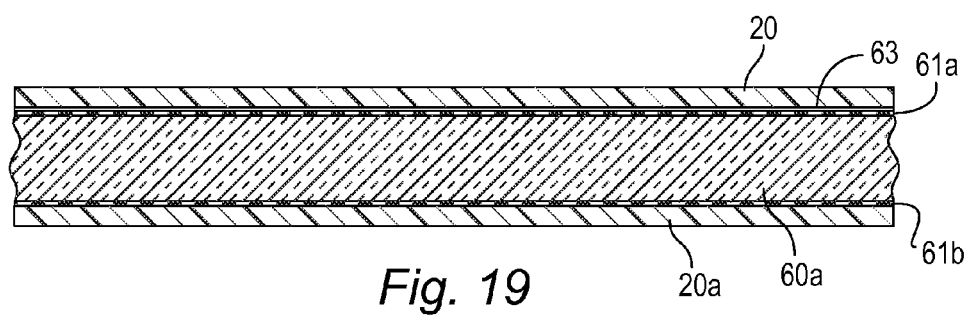

As shown in FIG. 19, the back side etch stop layer 61b is then spin coated with HD MICROSYSTEM™ Polyimide Product HD8820 to form a back layer of polyimide 20a. In alternative embodiments, different polyimides can be used with the methods and assemblies herein. The back layer of polyimide 20a is cured in Nitrogen at 350° C. until a film thickness of 12 µm is rendered. The front side etch stop layer 61a is also spin coated with HD MICROSYSTEM™ Polyimide Product HD8820 and cured in Nitrogen at 325° C. to achieve a front side inner polyimide layer 20 having a thickness of about 12 µm. 0.5 µm of the front side polyimide layer 20 is removed by plasma reactive ion etching (RIE) to create texture and surface micro-roughness. The gas mixture used in the RIE includes oxygen with 2% of Tetrafluoromethane ($CF_4$). The final thickness of the front side polyimide layer 20 afterwards is about 11.5 µm.

With reference to FIG. 20, an upper photoresist 77a and lower photoresist 77b are respectively positioned onto the upper and lower ends of the front side polyimide layer 20. A layer of multiple different metals 10 is selectively deposited on the front side polyimide layer 20 and the photoresists 77a and 77b, by electron beam evaporation and a lift-off process. The lift-off process is a photolithography method to create structure patterns using photoresists 77a and 77b as a sacrificial material. More specifically an upper positioned photoresist 77a prevents the upper portion of metal 10a from attaching to the front side polyimide layer 20 while a lower positioned photoresist 77b prevents the lower portion of metal 10b from attaching to the front side polyimide layer 20. The metal layer 10 is ordered from bottom to top as: 3 µm of titanium and 1 µm of gold. Different metal types and thickness, including only one type of metal can be used alternatively. The photoresists 77a and 77b are etched away and the metal layers 10a and 10b positioned on top of them are also removed by lift-off, leaving the remaining metal layer 10 shown in FIG. 21.

Figure 22:
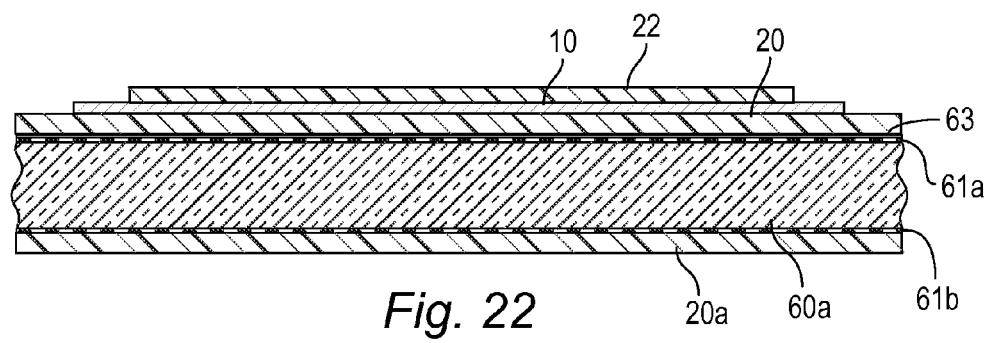

As shown in FIG. 22, an outer layer of polyimide 22 is spin coated on top of the metal layer 10. The outer layer of polyimide 22 is HD8820, as used above. Alternatively, different types of polyimides or insulators such as deposited nitride or oxide material can be used with this step but it is preferred that the polyimide layers 20, 20a, and 22 are the same polyimide. The layer of polyimide 22 is photodefinable having similar properties as a photoresist and thus can be defined and patterned by photolithography to expose the metal layer contact tip. When the polyimide layer 22 is developed away, the upper and lower contact ends of the metal layer 10 are exposed which allows them to electrically connect two devices when positioned in an interposer. The outer layer of polyimide 22 is cured in Nitrogen at 300° C.

Figure 23:
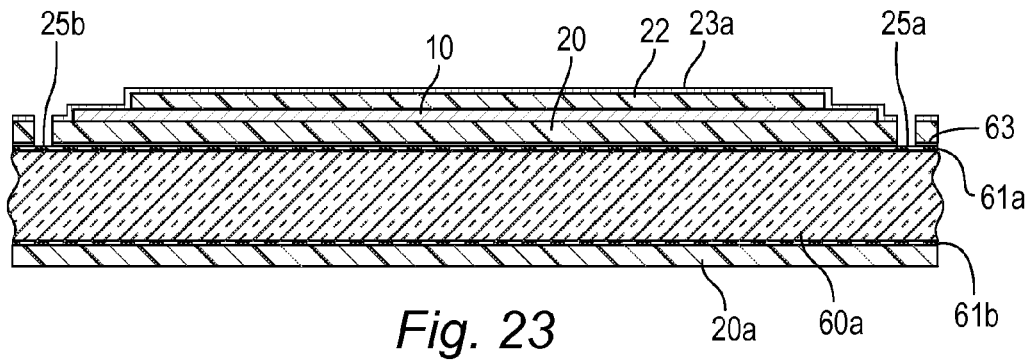

The inner layer of polyimide 20 is then patterned and etched to define the shape of the contact pins. More specifically, the inner polyimide layer 20 is etched by RIE, a plasma etching. The gas mixture used in the RIE is oxygen with 2% tetrafluoromethane ($CF_4$). The etching hard mask 23a is a thin pattern metal layer of vacuum deposited aluminum. Alternatively the etching hard mask 23a can be a thick photolithographic pattern resist. As shown in FIG. 23 upper and lower etching trenches 25a and 25b are formed through the inner layer of polyimide 20 where no hard mask is present. The etching is selectively stopped at the front silicon nitride layer 61a underneath. The dry etch hard mask 23a is removed by any suitable wet etching system such as a pre-mixture of phosphoric acid and acetic acid.

Figure 24:
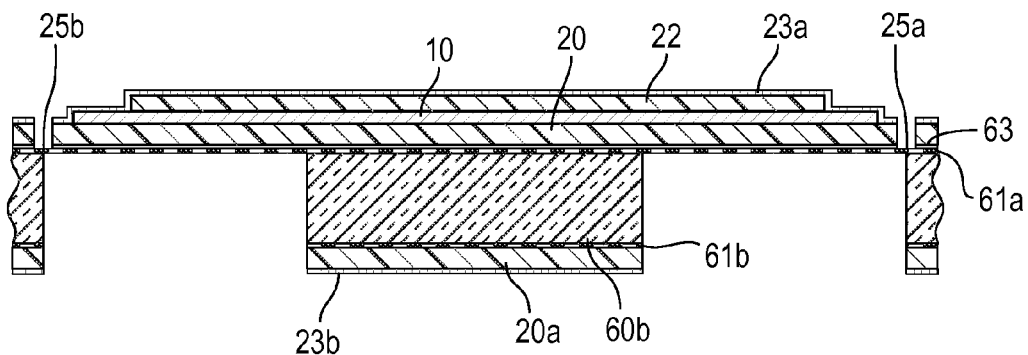

As shown in FIG. 24, a dry etch hard mask 23b suitable for deep reactive ion etch (DRIE) is then applied to the back layer of polyimide 20a. The hard mask 23b is a thin patterned metal layer of vacuum deposited aluminum. Alternatively, the hard mask 23b could be made of a thick photoresist. The back layer of polyimide 20a is then etched using RIE as described in the previous step and selectively stopping at the back layer of silicon nitride 61b. The exposed back layer of silicon nitride 61b is then etched by RIE using a gas mixture of $CF_4$ and 2% oxygen. This process will slightly etch the silicon substrate 60a. The bulk of the silicon substrate 60a however will be etched by DRIE, a dry plasma etching process that etches silicon at a steep vertical angle. The etching process includes two steps: etching and passivating. The etching step includes a gas mixture of sulphur hexa-flouride ($SF_6$) and small percent of $O_2$. The passivation step involves the gas octafluorocyclobutane ($C_4F_8$) and creates a thin organic layer that coats the wall of the etch trench to reduce the possibility of etching the side walls during the etching steps. The final etching step stops at the front layer of silicon nitride 61a. Once DRIE is complete, the initial silicon layer 60a is shaped in the form of a rectangle 60b.

Figure 25:
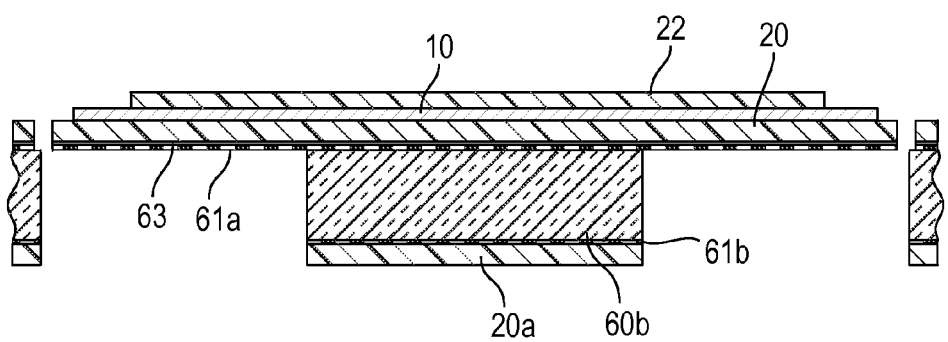

With respect to FIG. 25, the dry etch hard mask 23b is removed by any suitable wet etching system such as a pre-mixture of phosphoric acid and acetic acid. The final step is to etch the exposed silicon nitride layer 61a at the etching trenches 25a and 25b to release the interposer pin. This etching can be done by RIE system using gas mixture of $CF_4$ and 2% oxygen. The back layer of polyimide 20a remains on the rectangular silicon substrate 60b for use with an interposer.

The invention may be embodied in other specific forms besides and beyond those described herein. The foregoing embodiments are therefore to be considered in all respects illustrative rather than limiting, and the scope of the invention is defined and limited only by the appended claims and their equivalents, rather than by the foregoing description.

The invention claimed is:

1. An interposer pin comprising:
 a rigid substrate operably coupled to an upper cantilever and a lower cantilever electrically coupled to each other, wherein,
 the upper cantilever is configured to flex towards the substrate and comprises a first layer of polyimide and a first layer of metal, wherein the metal is configured to directly electrically couple to a first device positioned above the upper cantilever; and
 the lower cantilever is configured to flex towards the substrate and comprises a first layer of polyimide and a first layer of metal, wherein the metal is configured to directly electrically couple to a second device positioned below the lower cantilever.

2. The interposer pin of claim 1, wherein the rigid substrate is made of a material selected from the group consisting of: glass, ceramic, silicon, hard polymer, and metal.

3. The interposer pin of claim 1, wherein the rigid substrate has a thickness between 50-500 µm.

4. The interposer pin of claim 1, wherein the interposer pin is one of a plurality of interposer pins laterally positioned along the rigid substrate to define a strip of interposer pins.

5. The interposer pin of claim 4, wherein the strip comprises flanges that extend laterally on the left and right sides.

6. The interposer pin of claim 1, wherein the upper cantilever and lower cantilever each comprise a second layer of metal.

7. The interposer pin of claim 1, wherein the upper cantilever and lower cantilever each comprise a second layer of polyimide such that the first metal layers are sandwiched between the first and second polyimide layers.

8. The interposer pin of claim 1, wherein the first layer of metal is selected from the group consisting of: gold, rhodium, palladium, and cobalt.

9. An array of interposer pins comprising:
 a frame having a main body defined by an upper surface, lower surface, wherein the frame comprises a plurality of slots that vertically traverse through the main body of the frame and have openings through the upper and lower surfaces, and wherein the plurality of slots are individually configured to receive a strip having a plurality of interposer pins; and
 a plurality of strips, individually configured to be positioned within one of the plurality of slots in the frame, wherein the strips individually comprise: a rigid substrate operably coupled to a plurality of interposer pins, wherein the interposer pins individually comprise:
 an upper cantilever and a lower cantilever electrically coupled to each other, wherein,
 the upper cantilever extends through the slot opening on the upper surface of the frame and is configured to flex towards the rigid substrate and comprises a first layer of polyimide and a first layer of metal, wherein the first metal layer is configured to directly electrically couple to a first device positioned above the frame; and
 the lower cantilever extends through the slot opening on the lower surface of the frame and is configured to flex towards the rigid substrate, and comprises a first layer of polyimide and a first layer of metal, wherein the first metal layer is configured to directly electrically couple to a second device positioned below the frame.

10. The array of claim 9, wherein the frame comprises a material selected from the group consisting of: polyimide, ceramic, hard plastic, mylar, glass, metal, and silicon.

11. The array of claim 9, wherein the slots are created by a process selected from the group consisting of: laser machining, chemical etching, and mechanical etching.

12. The array of claim 9, wherein the plurality of strips individually comprise side flanges configured to securely and releasably couple to the upper surface of the frame when the strips are positioned into the slots.

13. The array of claim 9, wherein the upper and lower surfaces of the frame individually comprise a plurality of spacers, wherein the spacers on the upper surface are configured to abut against the first device positioned above the frame and the spacers on the lower surface are configured to abut against the second device positioned below the frame, and wherein the spacers are configured to compress when the first metal layer of the upper cantilevers electrically couples to the first device and the first metal layer of the lower cantilevers electrically couples to the second device.

14. The array of claim 13, wherein the plurality of spacers comprise rubber and the spacers on the upper surface of the frame are the same height and the plurality of spacers on the lower surface of the frame are the same height to allow for uniform electrical coupling between the upper and lower cantilevers and the first and second devices.

15. The interposer pin of claim 1, wherein the polyimide layer of the upper and lower cantilevers is directly attached to the rigid substrate, and the metal layer of the upper and lower cantilevers is directly attached on the polyimide layer such that it is not in direct contact with the rigid substrate.

16. The interposer pin of claim 15, wherein the polyimide layer of the upper and lower cantilevers is a single continuous layer, and the metal layer of the upper and lower cantilever is a single continuous layer and the upper and lower cantilevers are vertically aligned along the rigid substrate.

17. The interposer pin of claim 16, wherein the upper and lower cantilevers are both arched in the shape of a bow.

18. The interposer pin of claim 15, wherein the polyimide layer of the upper and lower cantilevers is longer than the metal layer such that the polyimide layer makes initial contact with the first and second device and as the upper and lower cantilevers flex towards the rigid substrate during compression, the metal layer of the upper and lower cantilevers slides to electrically couple with the first and second devices.

19. The interposer pin of claim 1, wherein the metal layer of the upper and lower cantilevers has a thickness of between 3-5 microns.

* * * * *